(12) United States Patent
Sampsell et al.

(10) Patent No.: US 12,140,474 B2
(45) Date of Patent: Nov. 12, 2024

(54) AMBIENT LIGHT SENSING

(71) Applicant: ams International AG, Jona (CH)

(72) Inventors: Matthew Sampsell, Melissa, TX (US); George R. Kelly, McKinney, TX (US); James Archibald, Jona (CH)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 18/000,930

(22) PCT Filed: Jun. 1, 2021

(86) PCT No.: PCT/EP2021/064646
§ 371 (c)(1),
(2) Date: Dec. 6, 2022

(87) PCT Pub. No.: WO2021/249823
PCT Pub. Date: Dec. 16, 2021

(65) Prior Publication Data
US 2023/0228621 A1 Jul. 20, 2023

(30) Foreign Application Priority Data
Jun. 9, 2020 (GB) ..................................... 2008691

(51) Int. Cl.
*G09G 3/3225* (2016.01)
*G01J 1/02* (2006.01)
(Continued)

(52) U.S. Cl.
CPC ........... *G01J 1/4204* (2013.01); *G01J 1/0233* (2013.01); *G01J 1/0238* (2013.01); *G01J 1/0429* (2013.01);
(Continued)

(58) Field of Classification Search
CPC ...... G01J 1/4204; G01J 1/0233; G01J 1/0238; G01J 1/0429; H10K 59/60;
(Continued)

(56) References Cited

U.S. PATENT DOCUMENTS 10,495,798 B1 * 12/2019 Peng ...................... G02B 27/01
10,672,852 B1 * 6/2020 Chen .................. H10K 59/8791
(Continued)

FOREIGN PATENT DOCUMENTS

| CN | 109425427 A | 3/2019 |
|---|---|---|
| EP | 3588024 A1 | 1/2020 |
| EP | 3671146 A1 | 6/2020 |

OTHER PUBLICATIONS

Gangl, Martin (EP Authorized Officer), International Search Report and Written Opinion in corresponding International Application No. PCT/EP2021/064646 mailed on Sep. 7, 2021, 16 pages.
(Continued)

*Primary Examiner* — Sejoon Ahn
(74) *Attorney, Agent, or Firm* — MH2 Technology Law Group LLP

(57) ABSTRACT

A system comprising a display and an ambient light sensing module, the ambient light sensing module being located beneath the display. The display comprises an array of light emitting diodes and a first polarizer located above the display. The sensing module comprises a first sensor and a second sensor, a second polarizer being located above the second sensor.

15 Claims, 4 Drawing Sheets

(51) Int. Cl.
*G01J 1/04* (2006.01)
*G01J 1/42* (2006.01)
*H10K 59/60* (2023.01)
*G01J 1/44* (2006.01)
*H10K 59/80* (2023.01)

(52) U.S. Cl.
CPC ............ *G01J 1/4228* (2013.01); *H10K 59/60* (2023.02); *G01J 2001/444* (2013.01); *G09G 3/3225* (2013.01); *G09G 2360/144* (2013.01); *G09G 2360/16* (2013.01); *H10K 59/8791* (2023.02)

(58) Field of Classification Search
CPC ............ H10K 59/8791; G09G 3/3225; G09G 2360/144; G09G 2360/16
See application file for complete search history.

(56) References Cited

U.S. PATENT DOCUMENTS

| | | | | |
|---|---|---|---|---|
| 2008/0297898 | A1* | 12/2008 | Martin | G02B 27/281 359/490.01 |
| 2009/0168613 | A1* | 7/2009 | Sirat | G02B 1/02 356/138 |
| 2012/0086712 | A1* | 4/2012 | Jung | H04N 13/398 345/419 |
| 2012/0154806 | A1* | 6/2012 | Brunfeld | G01B 11/2441 356/369 |
| 2014/0132578 | A1* | 5/2014 | Zheng | G01J 1/4228 345/207 |
| 2016/0245689 | A1* | 8/2016 | Smith | H04N 17/002 |
| 2018/0315357 | A1* | 11/2018 | Nam | G09F 13/22 |
| 2018/0357462 | A1* | 12/2018 | Mackey | H01L 25/167 |
| 2019/0050096 | A1* | 2/2019 | Wang | H10K 59/35 |
| 2019/0121007 | A1* | 4/2019 | Chen | G02B 6/0056 |
| 2019/0221770 | A1* | 7/2019 | Seki | H10K 50/86 |
| 2019/0242754 | A1* | 8/2019 | Nagamori | H04B 10/58 |
| 2019/0252471 | A1* | 8/2019 | Inoue | G09F 9/30 |
| 2019/0353955 | A1* | 11/2019 | Kim | G02F 1/133528 |
| 2019/0392752 | A1* | 12/2019 | Chen | G01J 1/4204 |
| 2020/0072673 | A1* | 3/2020 | Sassone | G01J 1/4228 |
| 2020/0105183 | A1 | 4/2020 | Dodson et al. | |
| 2021/0131864 | A1* | 5/2021 | Lim | A61B 5/0059 |
| 2021/0132719 | A1* | 5/2021 | Park | G06F 3/0412 |
| 2021/0134231 | A1* | 5/2021 | Soda | G06F 3/013 |

OTHER PUBLICATIONS

International Preliminary Report on Patentability in corresponding International Application No. PCT/EP2021/064646 mailed on Dec. 22, 2022, 13 pages.

* cited by examiner

AMBIENT LIGHT SENSING

CROSS-REFERENCE TO RELATED APPLICATIONS

The present application is the national stage entry of International Patent Application No. PCT/EP2021/064646, filed on Jun. 1, 2021, and published as WO 2021/249823 A1 on Dec. 16, 2021, which claims the priority to Great Britain Application No. 2008691.4, filed on Jun. 9, 2020, all of which are incorporated by reference herein in their entireties.

TECHNICAL FIELD OF THE DISCLOSURE

The disclosure relates to ambient light sensing, for example in a system comprising a display. The display may for example form part of a smartphone or a tablet.

BACKGROUND OF THE DISCLOSURE

The present disclosure relates to improvement of ambient light sensing, for example in a smartphone or tablet.

A smartphone conventionally comprises a display. The display may for example be an array of light emitting diodes (LED array), for example an array of organic light emitting didoes (OLED array). The display may be used to display content such as photographs, websites, emails, etc. to a user. An ambient light sensor is located beneath the display. The ambient light sensor measures the intensity of light incident on the display. The measured intensity of the ambient light may be used to adjust the intensity of light emitted by the display in order to optimize the viewing experience, optimize battery life, inform photography, etc.

A problem associated with providing an ambient light sensor beneath a display is that light which is not ambient light is incident upon the sensor. In particular, some light emitted by the display may be incident upon the ambient light sensor. This may cause the ambient light sensor to provide an inaccurate output.

It is an aim of the present disclosure to address the above problem.

SUMMARY

In general, this disclosure proposes to overcome the above problem by providing sensing ambient light using two sensors, a polarizer being located above one of the sensors. The ambient light has different polarization characteristics than light emitted by the display. The effect of the polarizer upon light emitted by the display is different from the effect of the polarizer upon ambient light. Because one of the sensors has a polarizer, the ambient light and the display light will generate different outputs from the sensors. The different outputs allow the ambient light to be distinguished from at least some of the light emitted by the display.

According to a first aspect of the present disclosure, there is provided a system comprising a display and an ambient light sensing module, the ambient light sensing module being located beneath the display, wherein the display comprises an array of light emitting diodes and a first polarizer located above the display, and wherein the sensing module comprises a first sensor and a second sensor, a second polarizer being located above the second sensor.

The effect of the second polarizer on ambient light (which has been polarized by the first polarizer) is different to the effect of the second polarizer on light emitted by the display (which has not been polarized by the first polarizer). This advantageously allows ambient light to be distinguished from at least some display light using outputs from the first and second sensors.

The first polarizer may be a circular polarizer.

The second polarizer may be a circular polarizer which is inverted relative to the first circular polarizer.

In an embodiment, no polarizer is located over the first sensor.

A third circular polarizer with an opposite handedness to the second polarizer may be located over the first sensor.

The sensing module may further comprise a third sensor. A third circular polarizer with an opposite handedness to the second polarizer may be located over the third sensor.

According to a second aspect of the invention there is provided an ambient light sensing module comprising a first sensor and a second sensor, wherein a polarizer is provided over the second sensor and no polarizer or a different polarizer is provided over the first sensor.

The ambient light sensing module advantageously allows discrimination between ambient light and light emitted by a display, when the ambient light sensing module is located beneath the display. This is because displays conventionally include a polarizer which modifies the polarization of ambient light but does not modify (or differently modifies) the polarization of display emitted light. The effect on ambient light of the polarizer provided over the second sensor is different to the effect on light emitted by the display. As a result, the outputs from the first and second sensors behave differently for ambient light and display light, and this difference may be used to distinguish between ambient light and at least some display light.

The polarizer provided over the second sensor may be a circular polarizer.

The circular polarizer may comprise a quarter wave-plate located over a linear polarizer.

The quarter wave-plate may also be located over the first sensor.

The linear polarizer may be located directly on top of the first sensor.

The circular polarizer may be located directly on top of the linear polarizer.

The first sensor may comprise a plurality of first detectors. The second sensor may comprises a plurality of second detectors.

The first detectors and the second detectors may both form part of the same array of detectors.

The polarizer may be provided over the second sensor as stripes on the second detectors.

The polarizer provided over the second sensor may be provided in a chessboard arrangement on the second detectors.

The different polarizer may be a circular polarizer with an opposite handedness to the circular polarizer provided over the second sensor.

The ambient light sensing module may further comprise a third sensor, wherein no polarizer is provided over the third sensor.

Each sensor may comprise a set of sub-sensors configured to detect light from different parts of the spectrum.

According to a third aspect of the invention there is provided a smartphone, tablet, or other device comprising the system of the first aspect, and further comprising a processor and a memory.

Different features of the first, second and third aspects of the invention may be combined with each other.

According to a fourth aspect of the invention there is provided a method of sensing ambient light which has passed through a display comprising an array of light emitting diodes configured to emit display light, the method comprising using a first circular polarizer to circularly polarize ambient light incident upon the display before the ambient light passes through the array of light emitting diodes, using a second circular polarizer, which is inverted relative to the first circular polarizer, to polarize and block some of the ambient light after it has passed through the array of light emitting diodes, sensing ambient light and display light which has not passed through the second circular polarizer to obtain a first output, sensing ambient light and display light which has passed through the second circular polarizer to obtain a second output, and comparing the first and second outputs to distinguish between the ambient light and the display light.

The second circular polarizer may configured to block the ambient light.

The method may further comprise using information from a previously performed calibration to distinguish between the ambient light and the display light.

Light at different wavelengths may be sensed. The wavelengths may be taken into account when distinguishing between the ambient light and the display light.

Finally, the present display system disclosed here utilises a novel approach at least in that first and second circular polarizers are used to distinguish between display light and ambient light.

BRIEF DESCRIPTION OF THE DRAWINGS

Some embodiments of the disclosure will now be described by way of example only and with reference to the accompanying drawings, in which.

DETAILED DESCRIPTION OF THE PREFERRED EMBODIMENTS

Generally speaking, the disclosure provides a system comprising a display and an ambient light sensing module, which uses circular polarizers to distinguish between ambient light and light emitted by the display.

Some examples of the solution are given in the accompanying figures.

Figure 1:
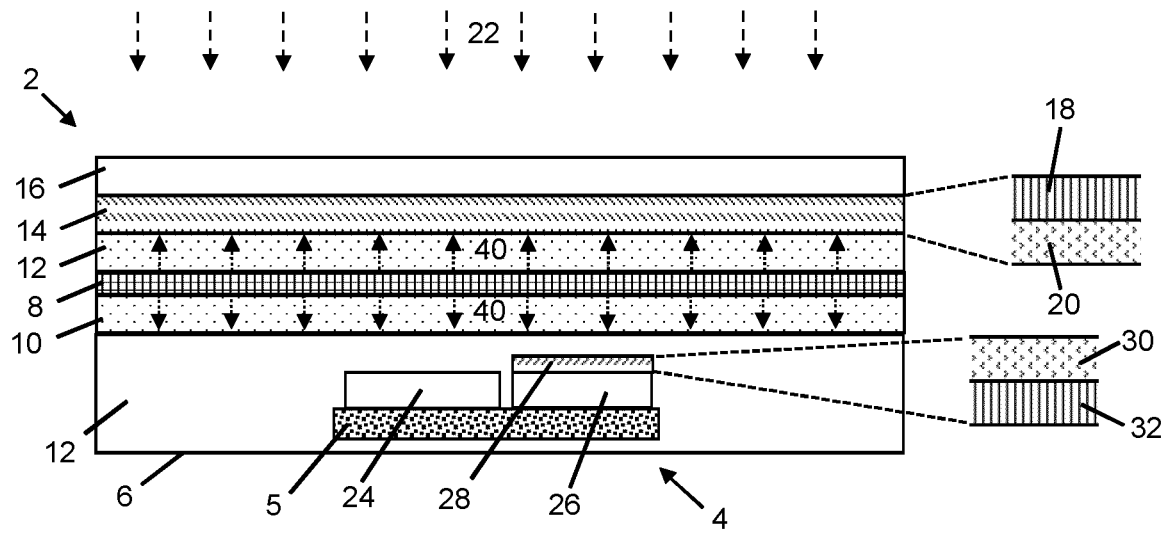
FIG. 1 schematically depicts in cross section a system according to an embodiment of the invention.

FIG. 1 schematically depicts in cross-section a system according to an embodiment of the invention. The system comprises a display 2 and an ambient light sensing module 4. In this example the ambient light sensing module 4 is located in a housing 6 which may form part of a smartphone, tablet or other device. The housing 6 may also support the display 2.

The display 2 comprises an array of light emitting diodes 8 the array may comprise organic light emitting diodes and may be referred to as an OLED array. The OLED array 8 is supported by a substrate 10 which is located beneath the OLED array. The substrate may for example be formed from silicates like glass or quartz, or plastics like polycarbonate or acrylic, or other materials. An encapsulation layer 12 is located above the OLED array 8. The encapsulation layer 12 may also be formed from glass, plastic, or other materials. A circular polarizer 14 is located above the encapsulation layer 12. A cover glass 16 is located over the circular polarizer 14. Other layers (not depicted) may be present in the display 2, and may be located between the depicted layers.

Part of the circular polarizer 14 is depicted in more detail in FIG. 1. The circular polarizer consists of a linear polarizer 18 and a quarter-wave plate 20. The linear polarizer 18 is located above the quarter-wave plate 20. Although the circular polarizer 14 is depicted as being between the encapsulation layer 12 and the cover glass 16, the circular polarizer may have a different position. For example, the circular polarizer 14 may be located on top of the cover glass 16. The linear polarizer 18 may be located over the cover glass 16, with the quarter-wave plate 20 being located beneath the cover glass. The cover glass 16 may function as the quarter-wave plate. In general, the circular polarizer 14 may be integrated with one or more of the cover glass 16 and the encapsulation layer 12. In general, the circular polarizer is located above the OLED array 8.

Ambient light 22 incident upon the display 2 is depicted in FIG. 1. The ambient light 22 may contain multiple, or substantially all, polarizations. The linear polarizer 18 polarizes the incident ambient light 22. That is, it transmits light with a linear polarization having a particular orientation. The resulting linearly polarized ambient light is incident upon the quarter-wave plate 20. The quarter-wave plate 20 converts the incident linear polarized ambient light into circularly polarized ambient light. Some of the circularly polarized ambient light will be reflected from layers of the display 2, for example from the OLED array 8. When reflected in a specular (non-scattering) manner, the handedness of the light flips (that is, a direction of rotation of the electric field vector switches). When the reflected light passes back through the quarter-wave plate 20, the quarter-wave plate changes the polarization of the light from circular to linear. However, due to the handedness flip from reflection, the linear polarization is now orthogonal to the linear polarization of the ambient light when it initially passed through the linear polarizer 14 (and orthogonal to the linear polarizer). Because the ambient light has a polarization which is orthogonal to the polarization of the linear polarizer 14 it is not transmitted by the linear polarizer. This is advantageous because it prevents ambient light from reflecting off layers of the display such as the OLED array and into the eye of a user. This undesirable reflection would be experienced by the user as glare caused by ambient light.

The ambient light sensing module 4 comprises a first sensor 24 and a second sensor 26 mounted on a substrate 5.

The substrate may for example be a circuit board, or flexible circuit. Sensors 24, 26 may be dies made of silicon or gallium-arsenide, with photodiode areas and circuitry. The same construction may be used for sensors of other embodiments. The sensors may be connected to the substrate via wirebonds. A second polarizer 28 is located above the second sensor 26. No polarizer is located over the first sensor 24.

The ambient light sensing module 4 may also include an encapsulation layer and/or protective mold (not depicted), and may also include a package mold (not depicted). The ambient light sensing module 4 may further include solder pads (not depicted) on its lowermost surface, which may be used to connect the module to a circuit board, interposer, or flexible circuit of a smartphone, table or other device. The same may apply for other embodiments.

Part of the second polarizer 28 is depicted in detail in FIG. 1. The second polarizer 28 consists of a quarter-wave plate 30 located above a linear polarizer 32. As noted above, the ambient light 22 on passing through the first polarizer 14 is at least partially circularly polarized (diffractive and scattering layers between the first polarizer 14 and the second polarizer 28 may have the effect of reducing the degree of polarization). The quarter-wave plate 30 of the second polarizer 28 is configured to convert a substantial amount of the remaining circularly polarized ambient light to linear polarization. The linear polarizer 32 of the second polarizer 28 is oriented such that its orientation is orthogonal to the new linear polarization orientation of the ambient light. As a result, much of the linearly polarized ambient light is blocked by the linear polarizer 32 of the second polarizer 28. Therefore, less ambient light passes through the second polarizer 28 and is incident upon the second sensor 26 (compared with the amount of ambient light that would be incident upon the second sensor 26 if the second polarizer 28 was not present).

As will be appreciated from the above, the second polarizer 28 is inverted relative to the first polarizer 14. In the first polarizer the linear polarizer 18 is on top of the circular polarizer 20, whereas in the second polarizer the circular polarizer 30 is on top of the linear polarizer 32. This arrangement may also apply for other embodiments.

The OLED array 8 emits display light 40. The display light does not have a particular polarization, but instead contains many, or substantially all, polarizations. Some of the substantially unpolarised display light 40 travels downwards towards the ambient light sensor module 4. The display light is incident upon the first sensor 24 and the second sensor 26 of the ambient light display module 4. The quarter-wave plate 30 of the second polarizer 28 applies a quarter-wave polarization rotation to the display light 40. However, because the display light is not polarized this has no net effect upon the display light. The linear polarizer 32 transmits only display light with a particular linear polarization. Thus, some of the display light is blocked by the linear polarizer 32, but a significant proportion of the display light 40 is incident upon the second sensor 26.

In the case of the first sensor 24, no polarizer is present and thus all display light 40 is incident upon the first sensor 24. In addition, all ambient light is incident upon the first sensor 24. In this context the term "all" is intended to mean that no light is blocked by a polarizer.

Considering the first sensor 24 and the second sensor 26 together, it can be understood that the signal output from the first sensor 24 will be different from the signal output from the second sensor 26 when they are in the presence of the same levels of ambient light 22 and display light 40. Specifically, the output from the first sensor 24 will be all ambient light 22 plus all display light 40, whereas the output from the second sensor 26 will be a proportion of the display light 40 and a relatively smaller proportion of the ambient light 22. The relative transmission of the polarizer 28 of ambient light compared to display light is known from factory (or post-factory) calibration of the system depicted in FIG. 1. Consequently, the outputs from the sensors 24, 26 allow the level of ambient light 22 to be distinguished from the level of display light 40. This is advantageous because display light could otherwise cause an inaccurate determination of the level of ambient light.

The calibration described above may include one-or-more ambient sources, one-or-more ambient light levels, one-or-more display light colors, one-or-more display light levels.

Although not depicted, other layers such as insulation layers may be present in the display (e.g. formed from $SiO_2$ and SiN).

Although a specific orientation of the linear polarizer 32 above the second sensor 26 has been described, the linear polarizer may have other orientations. The orientation of the second linear polarizer 32 should be such that it causes the relative levels of ambient and display light on the second sensor 26 to be different from the relative levels of the ambient and display light on the first sensor 24 (for the same overall levels of ambient and display light). The second polarizer 28 may be arranged such that the effect of the second polarizer on ambient light 22 is different to the effect of the second polarizer on display light 40. The effect of the polarizer may be referred to as a fractional polarization effect. The second polarizer 28 is fixed within the display 2 and does not move. Therefore, the fractional polarization effects for the ambient light 22 and the display light 40 can be considered to be constants (at least for a range of angular incidence where the polarizer has uniform angular response). The light incident upon the second sensor 26 (which may equivalently be referred to as the signal $S_p$ of the second sensor) may be expressed as follows:

$$S_p = f_{Dp} * D + f_{Ap} * A \quad \text{(Equation 1)}$$

Where $f_p$ is the fraction of display light D that passes the second polarizer 28, and $f_{Ap}$ is a fraction of ambient light A that passes the second polarizer 28. In the case of the first sensor 24 no polarizer is present, and the light incident upon the first sensor (which may equivalently be referred to as the signal S of the first sensor) is:

$$S = A + D \quad \text{(Equation 2)}$$

Equations 1 and 2 can be solved for the ambient light A as follows:

$$A = S - D \text{ and } D = (S_p - f_{Ap} A)/f_{Dp}$$

$$A = S - (S_p - f_{Ap} A)/f_{Dp}$$

$$A(1 - f_{Ap}/f_{Dp}) = S - S_p/f_{Dp}$$

$$A = (S - S_p/f_{Dp})/(1 - f_{Ap}/f_{Dp})$$

$$A = (f_{Dp} S - S_p)/(f_{Dp} - f_{Ap}) \quad \text{(Equation 3)}$$

From Equation 3 it can be seen that the level of ambient light A can be determined (i.e. the display light D can be excluded) using signals output from the first and second sensors 24, 26 when the fractional polarization effects $f_{Dp}$ and $f_{Ap}$ are known. The fractional polarization effects are the proportion of ambient light transmitted by the second polarizer 28 and the proportion of display light transmitted by the second polarizer. The fractional polarization effects may for example be determined during a calibration in which the amount of ambient light and amount of display light incident upon the sensor module 4 is known. It should be noted that the fractional polarization effects $f_{Dp}$, $f_{Ap}$ include a contribution from the circular polarizer 14 of the display 2, and thus the circular polarizer of the display should be in place when the calibration is performed.

In another form the Equation 3 may be expressed:

$$A = cS + dS_p \qquad \text{(Equation 4)}$$

The most advantageous choice of constants c, d can also be selected by doing a linear regression of calibration data under various lighting and display conditions. Constants c and d may be chosen such as to produce the lowest error between calculated and actual ambient light level.

In some arrangements sensors 24, 26 may each comprise an array of sub-sensors, or channels. Each channel may be configured to detect light from different parts of the spectrum. The channels may consist of different wavelength filters located over a photodetector. The channels provide not just the level of ambient light but also color information about the ambient light. In this case each channel of sensor 24 would have a signal $S_{ch}$ and each channel of sensor 26 would have a signal $S_{ch,p}$. Equation 4 (or an equivalent calculation) may be applied for each channel. This may increase the accuracy of the ambient light detection (ambient light and display light may behave differently at different wavelengths). Sub-sensors or channels which detect light from different parts of the spectrum may also be used in other embodiments.

In some arrangements the ambient light sensor module 4 may include a diffuser. The diffuser may diffuse incident light before it is incident upon the sensors 24, 26. In arrangements in which a diffuser is present, the diffuser should be provided below the second polarizer 28. This is because the diffuser will remove (or significantly reduce) the polarization of light which passes through it. The diffuser thus will remove (or significantly reduce) the polarization distinction between the ambient light 22 (which is circularly polarized) and the display light 40 (which is not polarized) before the light is incident upon the second polarizer 28. If the diffuser is located beneath the second polarizer then removal of polarization by the diffuser is not an issue because discrimination between the ambient light 22 and the display light 40 by the second polarizer 28 has already taken place.

In general, it may be desirable to include a diffuser in the ambient light sensing module 4 because the diffuser will remove or reduce undesirable effects that may occur if incident light is patterned. Specifically, if the incident light comprises light areas and dark areas, then the positions of the light and dark areas relative to the sensors 24, 26 will influence the intensity of light as detected by the sensors. Outputs from the sensors 24, 26 could vary even if the overall levels of ambient and display light do not change. The diffuser acts to mix the light and dark areas together and thereby provides an average intensity which is less affected by positions of incident light and dark areas.

Figure 2:
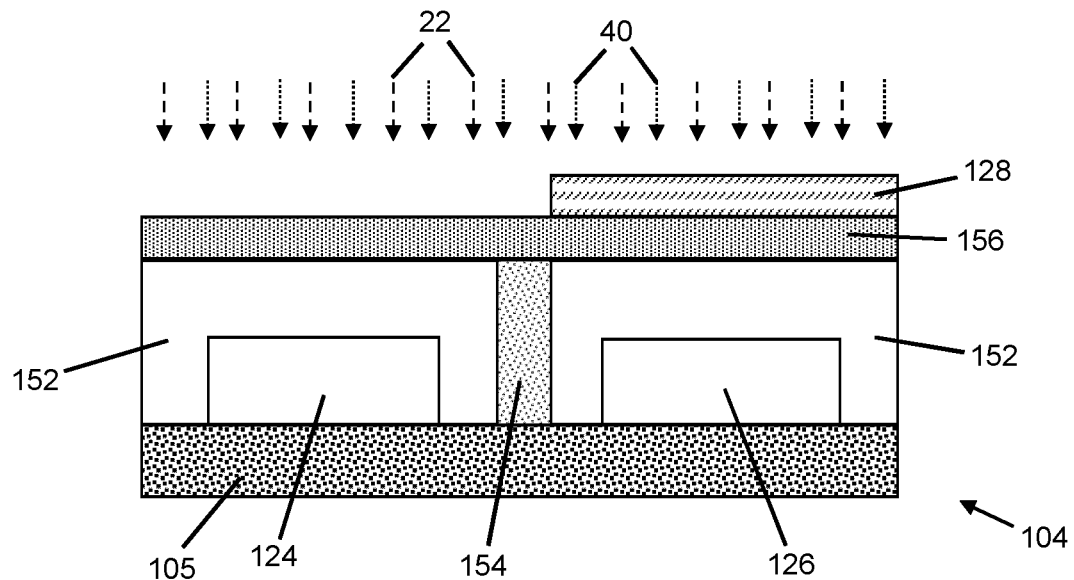
FIG. 2 schematically depicts in cross section an ambient light sensing module according to an embodiment of the invention.

FIG. 2 schematically depicts in cross-section an ambient light sensing module 104 according to an embodiment of the invention. In this example the first sensor 124 and the second sensor 126 are both supported on a substrate 105. The substrate may for example be a circuit board or flexible circuit. Such an arrangement may be used in connection with other ambient light sensing modules. An encapsulation layer 152 is provided over the first and second sensors 124, 126. An optical isolator 154 is located between the first sensor 124 and the second sensor 126. The optical isolator 154 may for example be a wall formed from a material which is opaque to ambient light and display light. A diffuser 156 is located on the encapsulation layer 152. The diffuser 156 is configured to diffuse incident light before that light passes to the first and second sensors 124, 126. A polarizer 128 is located above the second sensor 126 and above the diffuser 156. The polarizer 128 is a combination of a quarter waveplate and a linear polarizer (the quarter wave-plate being provided over the linear polarizer). As explained further above, the polarizer 128 causes the response of the second sensor 126 to differ from the response of the first sensor 124. Because the diffuser 156 is located beneath the polarizer 128 it does not affect the performance of the polarizer.

In some arrangements the optical isolator 154 may be omitted. This may be done for example where the separation between the first sensor 124 and the second sensor 126 is sufficiently large that light which has passed through the polarizer 128 will not be incident upon the first sensor 124, and light which has not passed through the polarizer will not be incident on the second sensor 126.

In a variation of the FIG. 2 embodiment the diffuser 156 may be omitted from the area above the second sensor 126. This may reduce cost, because manufacturing is simplified and because the cost of the diffuser itself is avoided. It will also reduce the thickness of the ambient light sensing module 104.

Figure 3:
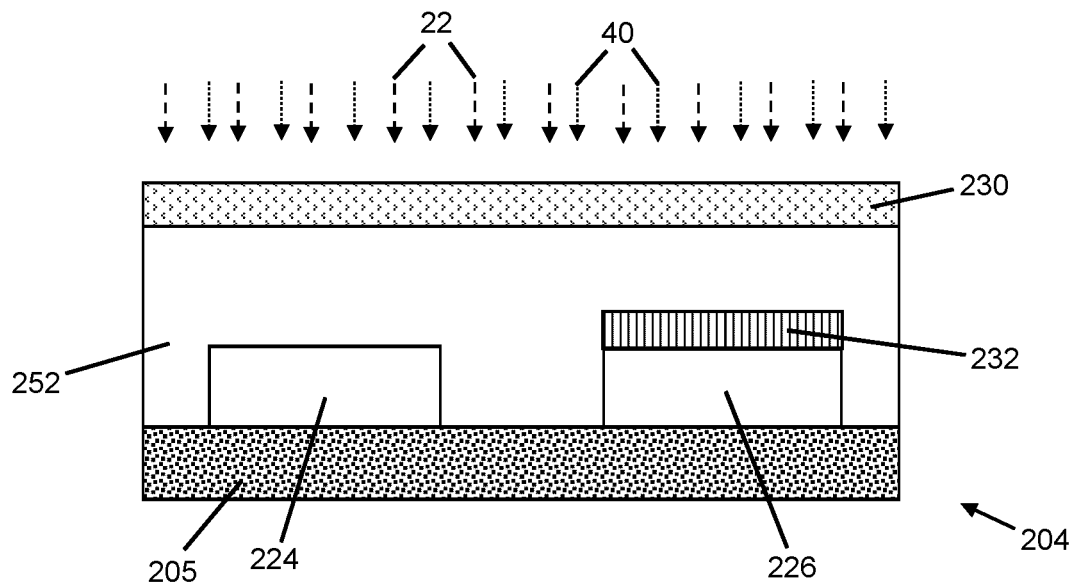
FIG. 3 schematically depicts in cross section an ambient light sensing module according to another embodiment of the invention.

FIG. 3 schematically depicts in cross-section an ambient light sensing module 204 according to another embodiment of the invention. In this embodiment a first sensor 224 and a second sensor 226 are supported on a substrate 205. A linear polarizer 232 is located directly on top of the second sensor 226. An encapsulation layer 252 is provided around the first and second sensors 224, 226. A quarter-wave plate 230 is located above the encapsulation layer. The quarter-wave plate 230 extends over both the first sensor 224 and the second sensor 226. The effect of the quarter-wave plate is to convert the ambient light 22 from circular polarization to linear polarization. The quarter-wave plate has substantially no effect upon the display light 40 because the display light is substantially not polarized.

In use, both display light 40 and ambient light 22 will be incident upon the first sensor 224. The orientation of the linear polarizer 232 located over the second sensor 226 may be selected such that the linearly-polarized portion of the ambient light 22 is blocked and is not incident upon the second sensor. Consequently, relatively more of the display light will be incident upon the second sensor 226. This advantageously allows outputs from the first and second sensors 224, 226 to be used to distinguish ambient light from display light.

Figure 4:
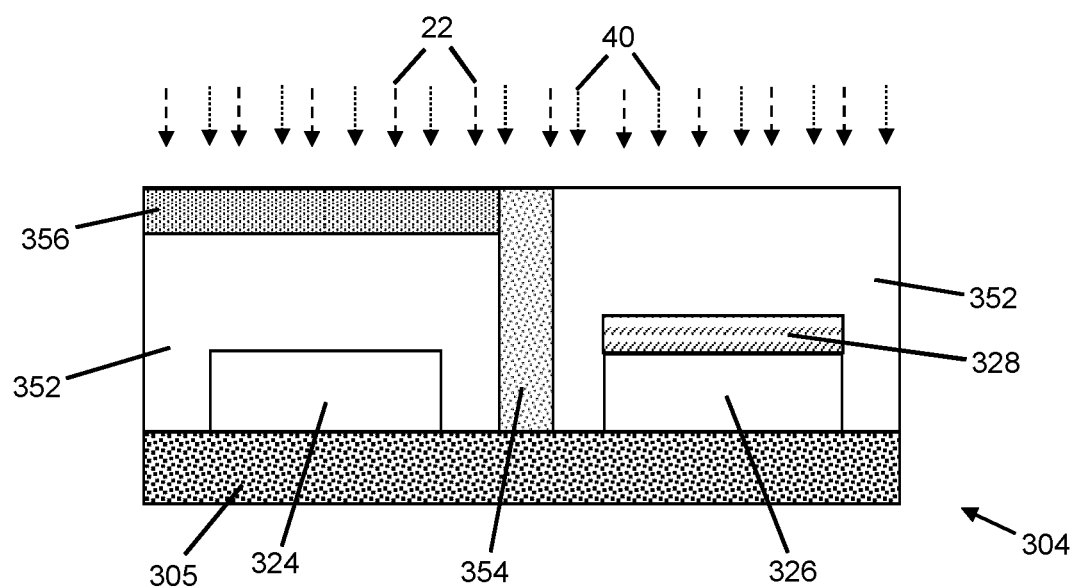
FIG. 4 schematically depicts in cross section an ambient light sensing module according to another embodiment of the invention.

A further embodiment of an ambient light sensing module 304 is depicted in FIG. 4. In this embodiment a first sensor 324 and a second sensor 326 are supported on a substrate 305. An optical isolator 354 (e.g. a wall) extends between the first and second sensors 324, 326. A circular polarizer 328 is located directly on top of the second sensor 326. As with embodiments described further above, the circular polarizer 328 consists of a quarter-wave plate located on top of a linear polarizer. An encapsulation layer 352 is provided over the first and second sensors 324, 326. A diffuser 356 is provided on the encapsulation layer above the first sensor 324.

In use, display light 40 and ambient light 22 incident upon the diffuser 356 is diffused by the diffuser before that light is incident upon the first sensor 324. Light which has passed through the diffuser 356 is blocked from being incident upon the second sensor 326 by the optical isolator 354. Display light 40 and ambient light 22 is incident upon the circular polarizer 328. The circular polarizer may be arranged for example to block ambient light 22 but transmit display light 40. This allows ambient light 22 to be distinguished from display light 40 using the outputs from the first and second sensors 324, 326 (as explained further above). Other orientations of the circular polarizer 328 may be used to obtain other responses from the second sensor 326.

Figure 5:
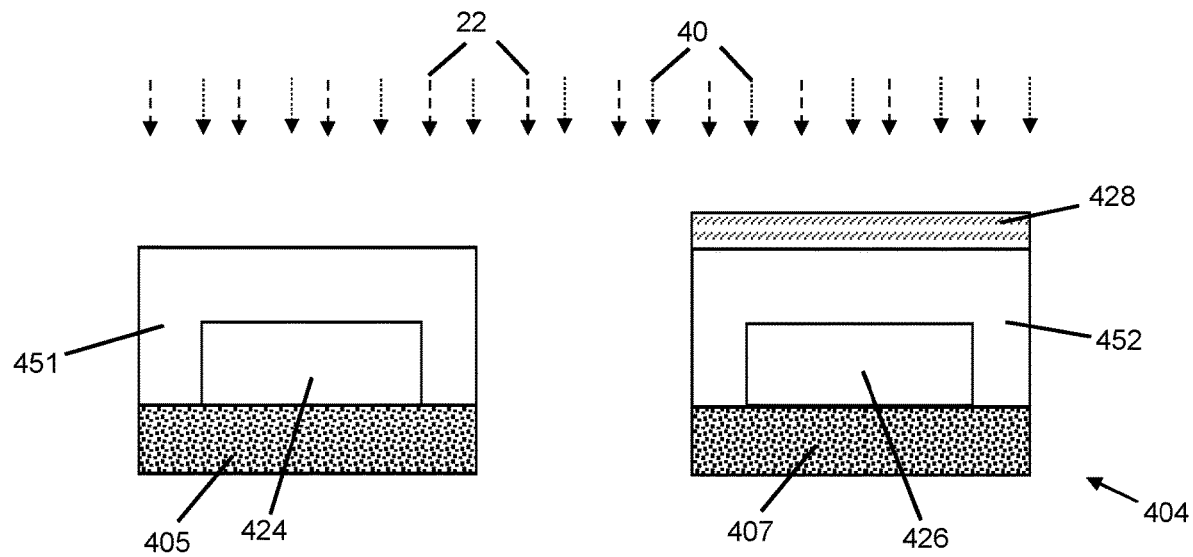
FIG. 5 schematically depicts in cross section an ambient light sensing module according to another embodiment of the invention.

FIG. 5 depicts an ambient light sensing module 404 according to another alternative embodiment of the invention. In this embodiment a first sensor 424 is provided on a first substrate 405, and a second sensor 426 is provided on a second substrate 407. The first and second sensors (and substrates) are spatially separated from one another (the sensing module 404 is provided as two spatially separated parts). The separation may for example be 0.5 mm or more. A first encapsulation layer 451 is provided over the first sensor 424 and a second encapsulation layer 452 is provided over the second sensor 426. A circular polarizer 428 is provided on the second encapsulation layer 452. A diffuser (not depicted) may be located between the circular polarizer 428 and the second encapsulation layer 452. A diffuser (not depicted) may be located on the first encapsulation layer 451.

Operation of this embodiment is analogous to operation of embodiments described further above. The circular polarizer 428 modifies the light incident upon the second sensor 426, and this allows ambient light to be distinguished from display light.

An advantage of this arrangement is that no reflow compliance is needed. That is, the circular polarizer 428 may be added after the rest of the sensor module has been soldered to a PCB, flex circuit, or interposer board. This means that the circular polarizer 428 does not have to stand up to high temperatures that are used during soldering. This advantage applies to any embodiment in which soldering may be performed before the circular polarizer is added. The advantage may also apply to embodiments in which a reflow compliant linear polarizer is present during soldering and a non-reflow-compliant quarter-wave plate is added after soldering.

Another advantage of the embodiment of FIG. 5 is that alignment of the quarter-wave plate and the linear polarizer which together make up the circular polarizer 428 may be performed during manufacture of the circular polarizer (and in advance of fitting the circular polarizer to the rest of the sensor module). This may be easier to achieve than providing a linear polarizer during manufacture of the sensing module and then providing the quarter wave plate at the correct alignment as a separate step (which may require higher precision manufacturing/assembly). This advantage applies to other embodiments in which the circular polarizer 428 is applied as a single pre-fabricated element.

A disadvantage is that due to the spatial separation between the first and second sensors 424, 426, there may be differences in the amount of light incident upon one sensor compared with the other (e.g. due to the presence of a shadow or a bright or dark area in an image). As a result, discrimination between ambient light and display light may be affected. A further disadvantage is that because the circular polarizer 428 is provided on top of the encapsulation layer 452 the ambient light sensing module may be relatively thick (compared with some other embodiments).

Figure 6:
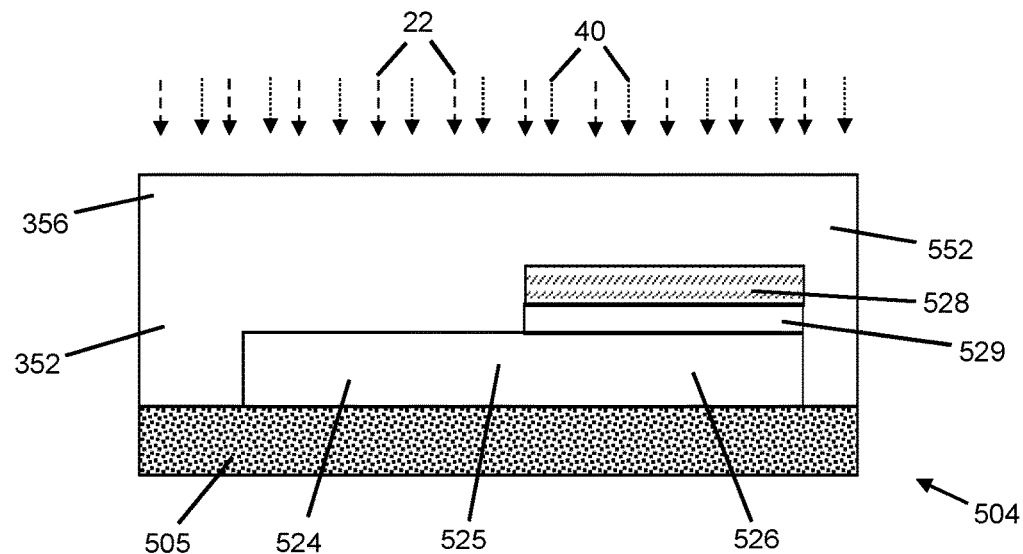
FIG. 6 schematically depicts in cross section an ambient light sensing module according to another embodiment of the invention.

FIG. 6 depicts another alternative embodiment of an ambient light sensing module 504. In this embodiment first and second sensors 524, 526 are provided as two different areas of the same detector array 525. The detector array 525 is supported by a substrate 505. As depicted, detectors on the left hand side of the array 525 form the first sensor 524, and detectors on the right hand side of the array form the second sensor 526. A circular polarizer 528 atop a carrier 529 is located on top of the detectors of the array 525 which make up the second sensor 526. The polarizer layers of polarizer 528 are assembled on carrier 529 in a larger form factor (e.g. a wafer or plate) and then subsequently diced or cut into and placed and bonded into the sensing module 504. In FIG. 6 this is shown assembled carrier down, but if fabricated differently it may be assembled carrier up, depending on the particular order the polarizer layers were deposited onto the carrier. As with other embodiments, the circular polarizer 528 may consist of a quarter-wave plate located on top of a linear polarizer. An encapsulation layer 552 is located over the detector array 525 and the circular polarizer 528.

In use, light which is incident upon detectors of the array 525 which form the first sensor 524 are used to provide a first output. Light which passes through the circular polarizer 528 and is incident upon the detectors of the array 525 which form the second sensor 526 is used to provide a second output. A processor (not depicted) may be configured to receive signals from the detector array 525 and generate the first and second outputs based upon the positions of the detectors which make up the detector array 525. A memory may be connected to the processor.

As with other embodiments, the effect of the circular polarizer 528 on the incident light may be used to distinguish between ambient light 22 and display light 40. An advantage of this arrangement is that the ambient light sensing module 504 may be relatively thin (compared for example with the embodiment depicted in FIG. 5), due to the polarizer being assembled inside the encapsulation layer 552 rather than above it. In other words, the polarizer is beneath any overmold or exterior sensor package rather than atop it. Another advantage of this embodiment is that the two sensors 524,526 are able to be closer together than 424,426 in FIG. 5. In addition to the footprint (size) of the overall system being smaller and lower cost, the sensors 524, 526 are seeing almost identical regions of the display above them, and almost identical regions of the ambient light above that. This will mean that Equation 3 is accurate over a wider range of lighting conditions.

In the depicted embodiment, the first sensor 524 is on the left hand side of the detector array 525 an the second sensor 526 is on the right hand side of the array. However, other configurations may be used. The first sensor 524 and the second sensor 526 may have any desired positions on the detector array 525. In some arrangements some area of the array 525 may be considered to be a 'dead' or non-sensing area between the first and second sensors 524, 526. That is, light incident upon that area may be excluded from consideration either due to no sensors being in that area or due to the signal from the sensor in that area being excluded from the calculations of ambient light. An advantage of such an arrangement is that it may reduce or prevent light which passed through the circular polarizer 528 from being incident upon the first sensor 524, and may reduce or prevent light which has not passed through the circular polarizer 528 from being incident upon the second sensor 526.

Figure 7:
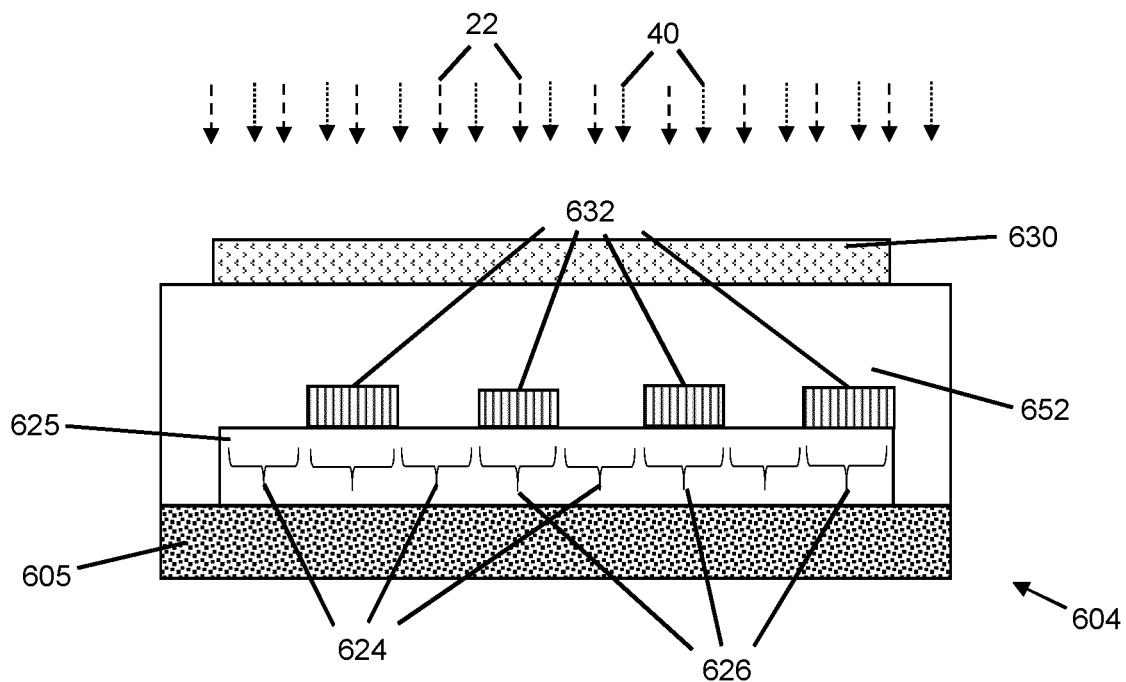
FIG. 7 schematically depicts in cross section an ambient light sensing module according to another embodiment of the invention.

A further embodiment of the invention is schematically depicted in FIG. 7. In this embodiment the ambient light sensing module 604 comprises a detector array 625 supported by a substrate 605. Areas of linear polarizer 632 are provided on the detector array 625 (e.g. directly on the detector array). An encapsulation layer 652 is provided over the detector array 625 and the linear polarizer areas 632. A quarter-wave plate 630 is provided on top of the encapsulation layer 652. A further encapsulation layer (not depicted) may be provided over all of the elements of the ambient light sensing module 604.

In this embodiment, areas of the detector array 625 which are located beneath the linear polarizer 632 together form a second sensor 626 of the module, and areas of the detector array which are not beneath the linear polarizers 632 together form a first sensor 624 (only some of these are labelled to avoid over complicating the figure). As with the preceding embodiment, a processor may be used to obtain a first output from the detectors in areas of the detector array 625 which make up the first sensor 624, and obtain a second output from detectors in areas of the detector array which form the second sensor 626. Ambient light will be converted to linear polarization by the quarter-wave plate 630 and will then be blocked (or modified) by the linear polarizers 632. Ambient light which does not pass through the linear polarizers 632 will not be affected. Thus, as with other embodiments, the output from the second sensor 626 is different from the output of the first sensor 624 and may be used to distinguish between ambient light and display light.

An advantage of this embodiment is that, because the first and second sensors are interdigitated, the possibility of a dark area or light area being incident upon the first sensor 624 and not the second sensor 626 is avoided or reduced. Another advantage of this arrangement is that it may be relatively straightforward to manufacture. This is because the linear polarizers 632 can be constructed with deposition and lithography processes which are also used to form the detector array's on-chip (or on-die) circuitry. The linear polarizers 632 may be formed on a wafer of sensor arrays. The wafer may be diced and the encapsulation 652 applied, following which the quarter wave plate 630 may be applied. The quarter wave plate 630 is larger than the linear polarizers 632, and has less constraint on spatial alignment (it merely needs to overlie the detector array 625). Rotational alignment of the quarter wave plate 630 may be achieved during assembly. A disadvantage of this embodiment is that adding the quarter wave plate uses an extra manufacturing step which is performed after a wafer of sensor arrays has been diced.

A further advantage of this embodiment (and the embodiment described further below) is that, if the linear polarizers are produced with the same deposition and lithography processes that produce the detector array's on-chip (or on-die) circuitry, it is easy to have multiple linear polarizer orientations on the same sensor array. This allows the inclusion for example of both left and right circular sensing orientations in a very small form factor (i.e. in a sensor module which occupies a relatively small total volume).

As with the embodiment of FIG. 6, in some arrangements some area of the array 625 may be considered to be a 'dead' or non-sensing area. Such area may be located at borders between detectors which make up the first sensor 624 and detectors which make up the second sensor 626.

Figure 8:
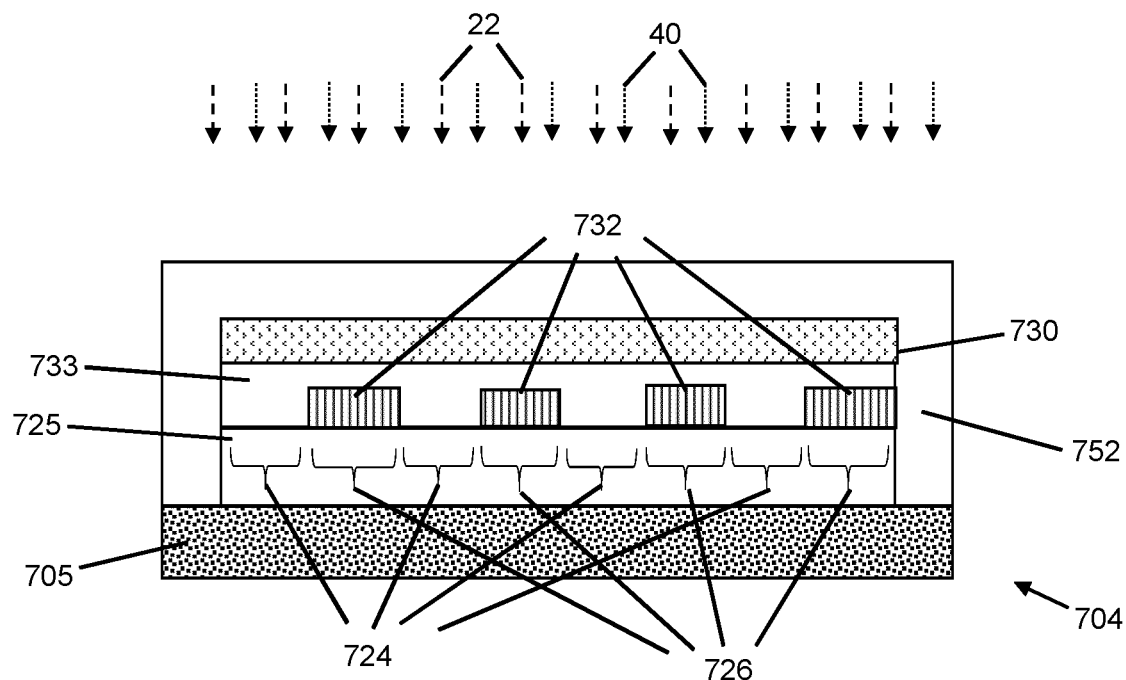
FIG. 8 schematically depicts in cross section an ambient light sensing module according to another embodiment of the invention.

FIG. 8 depicts a further alternative embodiment. In this embodiment of the ambient light sensing module 704, a detector array 725 is provided on a substrate 705. Areas of linear polarizer 732 are provided directly on top of detectors of the array. Other areas of the array are not provided with linear polarizers. A transparent layer 733 is provided above and between the areas of linear polarizer 732. A quarter-wave plate 730 is deposited over the areas of linear polarizer 732 (e.g. deposited on the transparent layer 733). An encapsulation layer 752 is provided over elements of the ambient light sensing module 704.

This embodiment works in the same way as the embodiment depicted in FIG. 7. That is, areas of the detector array 725 which are located beneath the linear polarizers 732 together form a second sensor 726 of the module, and areas of the detector array which are not beneath the linear polarizers 732 together form a first sensor 724. An advantage of this embodiment over the embodiment depicted in FIG. 7 is that it is thinner. Another advantage is that it may be formed as an integrated system. That is, a wafer of sensors may be formed, then the linear polarizer and the circular polarizer may be applied, whilst the wafer is still intact (e.g. in a wafer fab). The wafer may subsequently be diced into individual sensing modules. Thus, no additional assembly steps are required for the polarizer after dicing.

The areas of linear polarizer 732 may for example be formed as stripes on top of the detector array 725. Alternatively, the areas of linear polarizer 732 may for example be formed in a chessboard arrangement on top of the detector array 725. In general, the areas of linear polarizer 738 may have any arrangement, preferably one that distributes the areas of linear polarizer across the detector array. This minimises the possibility of a dark area or light area introducing an inaccuracy into the ambient light measurement by being incident upon the first sensor 725 and not on the second sensor 726 (or vice versa).

The total area of the first sensor 725 may be the same as the total area of the second sensor 726. Alternatively, the total areas of the sensors may differ from each other.

Any of the described embodiments of the ambient light sensing module may form part of a system which comprises a display (for example replacing the ambient light sensing module depicted in FIG. 1).

Embodiments of the invention may be used in any device where an ambient light sensor is located behind a display. For example, the device may be a smartphone, a tablet computer, a laptop computer, a computer monitor, a car dashboard and/or navigation system, an interactive display in a public space, a home assistant, etc.

In the above description the term "polarizer" may be interpreted as meaning something which selectively transmits light with a particular polarization (i.e. light with other polarizations are not transmitted). The term "wave-plate" may be interpreted as meaning something which alters the polarization state of light which passes through it, but does not selectively transmit light with a particular polarisation. The term "circular polarizer" may be interpreted as meaning a combination of a linear polarizer and a quarter wave-plate.

A quarter wave-plate as used by an embodiment of the invention may be a layer of birefringent crystal such as $SiO_2$ or $MgF_2$. The quarter wave-plate may be formed from liquid crystal. The quarter wave-plate may be formed from polycarbonate or plastic. The quarter wave-plate may be applied over other layers (e.g. over an encapsulation layer, or directly onto linear polarizer(s) of the second circular polarizer). The quarter wave-plate may be bonded onto an encapsulation layer, linear polarizer, or other layer.

A linear polarizer as used by an embodiment of the invention may formed as a wire grid (e.g. aluminum, copper, gold, silver, nickel, chromium, alloys thereof). The linear polarizer may be formed from doped or stretched PVA. The linear polarizer may be formed Silver nano-particles doped into and oriented in glass. The linear polarizer may be formed as a thin film stack of dielectric materials of differing indices of refraction (dielectrics such as $SiO2$, $SiN$, $TaO$, HfO). The linear polarizer may also be formed as a dielectric grid with interdigitated regions of differing index of refraction (dielectric such as SiO2, SiN, TaO, HfO).

Some of the above descriptions of embodiments refer to blocking the ambient light. In this context, the term "blocking" may be interpreted as significantly attenuating the ambient light but should not be interpreted as requiring that all ambient light is blocked (a small amount of ambient light may be transmitted for example if the polarizer is not 100% effective).

When discriminating between display light and ambient light, the wavelength of detected light may be taken into account. For example, the first and second sensors may comprise detectors configured to detect light at several different wavelengths (they may include wavelength filters). Equation 3 may be applied for each wavelength (or some of the wavelengths). Calibrations may be performed for each wavelength (or some of the wavelengths).

In some of the above described embodiments, a circular polarizer with a handedness opposite to the handedness of the display's circular polarizer is provided over one sensor, and no polarizer is provided over the other sensor. However, other arrangements may be used. For example, a circular polarizer with one handedness may be provided over one sensor, and a circular polarizer with opposite handedness may be provided over the other sensor. An advantage of this arrangement is that an ambient light sensing module with the arrangement may be fitted to a display without prior knowledge of the handedness of a circular polarizer of the display. Operation of the arrangement is similar to operation of above described embodiments. Because the circular polarizers will have a different effect on display light compared with ambient light, the difference may be used to distinguish between display light and ambient light.

In a further alternative arrangement, a circular polarizer with one handedness may be provided over one sensor, a circular polarizer with opposite handedness may be provided over a second sensor, and no polarizer may be provided over a third sensor. As with the previous arrangement, an ambient light sensing module with this arrangement may be fitted to a display without prior knowledge of the handedness of a circular polarizer of the display. Operation of the arrangement is similar to operation of above described embodiments. The first, second and third sensors will provide different outputs for given incident display and ambient light, and the differences may be used to distinguish between display light and ambient light.

In the above description, reference to the handedness of the circular polarizer may be interpreted as meaning the direction of rotation of the electric field vector of circularly polarized light which will be transmitted by the circular polarizer. For example, a circular polarizer may be configured to transmit left-handed or clockwise circularly polarized light.

A circular polarizer with opposite handedness may be configured to transmit right-hand or counter-clockwise circularly polarized light.

In the above description, each sensor referred to may each comprise a set of sub-sensors or channels (which may be referred to as spectral channels). The spectral channels may be configured to detect light from different parts of the spectrum. The spectral channels may consist of detectors with different absorptive and/or interference spectral filters atop the detectors (which may be referred to as wavelength filters). The detectors may be formed from different materials which have different associated spectral responses (such as Si or GaAs). Each spectral filter will have spectral response that combines with each detector's spectral response, providing an overall spectral response to the incident light. In this way information about the spectrum of the incident light can be collected. Furthermore, in a two sensor example such as used to derive Equations 3 and 4, Equations 3 and 4 (or other equivalent calculations) can be expressed for each spectral channel, and therefore used to differentiate between the spectrum of the display light and the spectrum of the ambient light. The spectral information may be used to determine, for example, the correlated-color temperature (CCT) of the ambient light and/or the color of the display screen. The coefficients in Eq 3-4 (or other equivalent calculations) may be chosen to produce minimum error of Lux, CCT, and/or other light measurements of interest.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A system comprising:
  a display, wherein the display comprises an array of light emitting diodes;
  an ambient light sensing module, the ambient light sensing module being located beneath the display, wherein the ambient light sensing module comprises a first sensor, a second sensor, and a third sensor;
  a first display polarizer located above the display;
  a first sensor polarizer located over the first sensor, wherein the first sensor polarizer is a first sensor circular polarizer;
  a second sensor polarizer located above the second sensor, wherein the second sensor polarizer has an opposite handedness to the first sensor polarizer; and
  a third sensor polarizer located over the third sensor, wherein the third sensor polarizer is a third circular polarizer with an opposite handedness to the second sensor polarizer,
  wherein the first sensor, the second sensor, and the third sensor each comprise a set of sub-sensors configured to detect light from different parts of the spectrum.

2. The system of claim 1, wherein the first display polarizer is a first display circular polarizer.

3. The system of claim 2, wherein the second sensor polarizer is a second sensor circular polarizer which is inverted relative to the first display circular polarizer.

4. An ambient light sensing module comprising:
  a first sensor;
  a second sensor;
  a first circular polarizer arranged over the first sensor; and a second circular polarizer arranged over the second sensor, wherein the second circular polarizer has an opposite handedness to the first circular polarizer, wherein the first circular polarizer comprises a quarter wave-plate located over a linear polarizer, wherein the linear polarizer is located directly on top of the first sensor, wherein the first circular polarizer is located directly on top of the linear polarizer.

5. The ambient light sensing module of claim 4, wherein the quarter wave-plate is also located over the first sensor.

6. The ambient light sensing module of claim 4, wherein the first sensor comprises a plurality of first detectors and the second sensor comprises a plurality of second detectors.

7. Sensing module of claim 6, wherein the first detectors and the second detectors both form part of the same array of detectors.

8. The ambient light sensing module of claim 7, wherein the second circular polarizer arranged over the second sensor is provided as stripes on the second detectors.

9. The ambient light sensing module of claim 7, wherein the second circular polarizer arranged over the second sensor is provided in a chessboard arrangement on the second detectors.

10. The ambient light sensing module of claim 4, further comprising a third sensor, wherein no polarizer is provided over the third sensor.

11. A computing device comprising:
a processor;
a memory;
a display, wherein the display comprises an array of light emitting diodes;
an ambient light sensing module, the ambient light sensing module being located beneath the display, wherein the ambient light sensing module comprises a first sensor, a second sensor, and a third sensor;
a first display polarizer located above the display;
a first sensor polarizer located over the first sensor, wherein the first sensor polarizer is a first sensor circular polarizer;
a second sensor polarizer located above the second sensor, wherein the second sensor polarizer has an opposite handedness to the first sensor polarizer; and
a third sensor polarizer located over the third sensor, wherein the third sensor polarizer is a third circular polarizer with an opposite handedness to the second sensor polarizer,
wherein the first sensor, the second sensor, and the third sensor each comprise a set of sub-sensors configured to detect light from different parts of the spectrum.

12. A method of sensing ambient light which has passed through a display comprising an array of light emitting diodes configured to emit display light, the method comprising:
circularly polarizing ambient light incident upon the display before the ambient light passes through the array of light emitting diodes using a first circular polarizer;
polarizing and blocking a first portion of the ambient light after the first portion of the ambient light has passed through the array of light emitting diodes using a second circular polarizer, which is inverted relative to the first circular polarizer;
polarizing a second portion of the ambient light after the second portion of the ambient light has passed through the array of light emitting diodes using a third circular polarizer with an opposite handedness to the second circular polarizer;
sensing ambient light and display light which has not passed through the second circular polarizer to obtain a first output;
sensing ambient light and display light which has passed through the second circular polarizer to obtain a second output;
sensing ambient light and display light which has passed or has not passed through the third circular polarizer to obtain a third output; and
comparing the first output, the second output, and the third output to distinguish between the ambient light and the display light.

13. The method of claim 12, wherein the second circular polarizer is configured to block the ambient light.

14. The method of claim 12, further comprising using information from a previously performed calibration to distinguish between the ambient light and the display light.

15. The method of claim 12 wherein light at different wavelengths is sensed, and the light at different wavelengths are used to distinguish between the ambient light and the display light.

* * * * *